United States Patent
Artman et al.

(10) Patent No.: US 8,014,971 B2
(45) Date of Patent: Sep. 6, 2011

(54) METHOD FOR VALIDATION OF THERMAL SOLUTION FOR AN ELECTRONIC COMPONENT

(75) Inventors: Paul T. Artman, Austin, TX (US); Shawn P. Hoss, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 11/538,460

(22) Filed: Oct. 4, 2006

(65) Prior Publication Data
US 2008/0086282 A1    Apr. 10, 2008

(51) Int. Cl.
*G01K 17/00* (2006.01)
(52) U.S. Cl. ...................................................... 702/136
(58) Field of Classification Search .................... 702/136
See application file for complete search history.

(56) References Cited

U.S. PATENT DOCUMENTS

| | | |
|---|---|---|
| 4,630,938 A | 12/1986 | Piorkowska-Palczewska et al. |
| 2004/0002655 A1 * | 1/2004 | Bolorforosh et al. ......... 600/459 |
| 2006/0064999 A1 * | 3/2006 | Hermerding et al. ........ 62/259.2 |

* cited by examiner

Primary Examiner — Tung S Lau
(74) Attorney, Agent, or Firm — Haynes and Boone, LLP

(57) ABSTRACT

In one embodiment a method includes operating a component coupled to the system at a first steady state average power consumption, measuring the temperature of the component to produce a first temperature measurement, operating the component at a second, higher power consumption for a first time period, and measuring the temperature of the component at the end of the first time period to produce a second temperature measurement. A transient thermal metric is calculated based at least in part on the first and second temperature measurements, and the transient thermal metric is used to infer the thermal coupling status of a heat dissipation appliance that is nominally thermally coupled to the component.

22 Claims, 6 Drawing Sheets

METHOD FOR VALIDATION OF THERMAL SOLUTION FOR AN ELECTRONIC COMPONENT

BACKGROUND

The description herein relates to information handling systems and the evaluation of thermal systems used in such systems.

As the value and use of information continue to increase, individuals and businesses seek additional ways to process and store information. One option available to users is information handling systems. An information handling system (IHS) generally processes, compiles, stores, and/or communicates information or data for business, personal, or other purposes thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

IHSs often contain one or more semiconductor components that have a high power density and/or high power consumption under some operating conditions. The convection and/or radiation cooling characteristics used for the IHS as a whole may be insufficient to remove the waste heat from such a component and keep the component within its normal operating temperature range. Such components are commonly fitted with a passive heat sink or dedicated fan/heat sink assembly to provide a larger surface area for the dissipation of waste heat. The heat sink requires a good thermal contact to the semiconductor package in order to effectively perform its function.

SUMMARY

A method of operating an IHS comprises operating a component coupled to the system at a first steady state average power consumption, measuring the temperature of the component to produce a first temperature measurement, operating the component at a second, higher power consumption for a first time period, and measuring the temperature of the component at the end of the first time period to produce a second temperature measurement. A transient thermal metric is calculated based at least in part on the first and second temperature measurements, and the transient thermal metric is used to infer the thermal coupling status of a heat dissipation appliance that is nominally thermally coupled to the component.

DETAILED DESCRIPTION

For purposes of this disclosure, an IHS includes any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an IHS may be a personal computer, a network storage device, or any other suitable device and may vary in size, shape, performance, functionality, and price. The IHS may include random access memory (RAM), one or more processing resources such as a central processing unit (CPU) or hardware or software control logic, ROM, and/or other types of nonvolatile memory. Additional components of the IHS may include one or more disk drives, one or more network ports for communicating with external devices as well as various input and output (I/O) devices, such as a keyboard, a mouse, and a video display. The IHS may also include one or more buses operable to transmit communications between the various hardware components.

Figure 1:
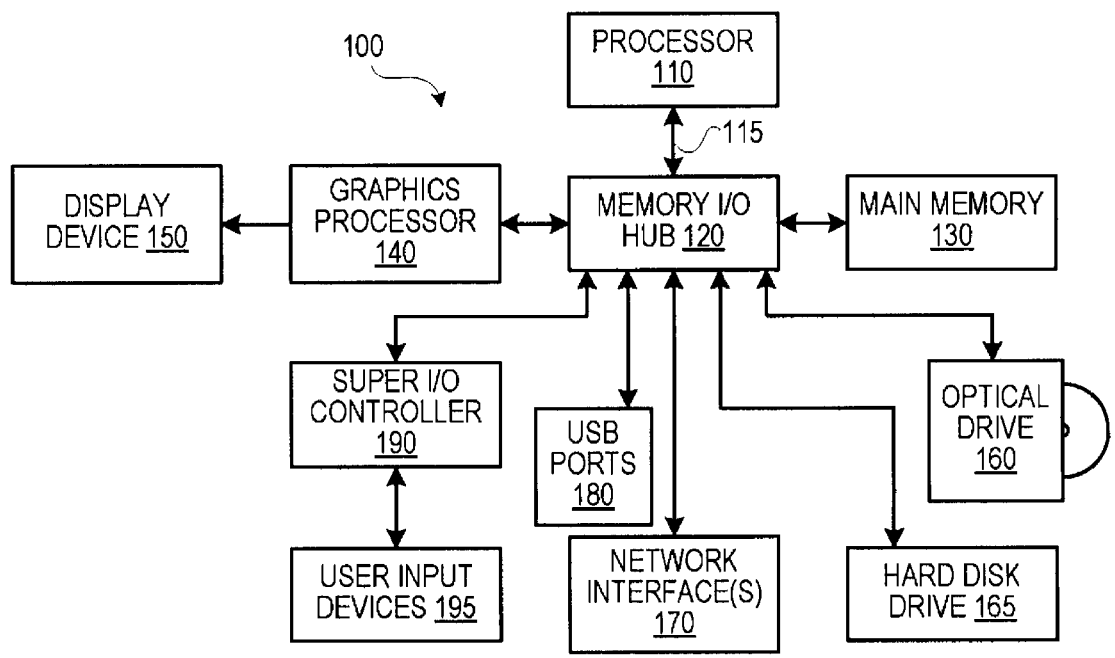
FIG. 1 is a block diagram illustrating an embodiment of an IHS.

FIG. 1 is a block diagram of one typical IHS. The IHS 100 includes a processor 110 such as an Intel Pentium series processor or one of many other processors currently available. A memory I/O hub chipset 120 (comprising one or more integrated circuits) connects to processor 110 over a front-side bus 115. Memory I/O hub 120 provides the processor 110 with access to a variety of resources. Main memory 130 connects to memory I/O hub 120 over a memory bus. A graphics processor 140 also connects to memory I/O hub 120, allowing the graphics processor to communicate, e.g., with processor 110 and main memory 130. Graphics processor 140, in turn, provides display signals to a display device 150.

Other resources can also be coupled to the system through memory I/O hub 120, including an optical drive 160 or other removable-media drive, one or more hard disk drives 165, one or more network interfaces 170, one or more USB (Universal Serial Bus) ports 180, and a super I/O controller 190 to provide access to user input devices 195, etc.

Not all IHSs include each of the components shown in FIG. 1, and other components not shown may exist. Furthermore, some components shown as separate may exist in an integrated package or be integrated in a common integrated circuit with other components. As can be appreciated, many systems are expandable, and include or can include a variety of components, including redundant or parallel resources.

Figure 2:
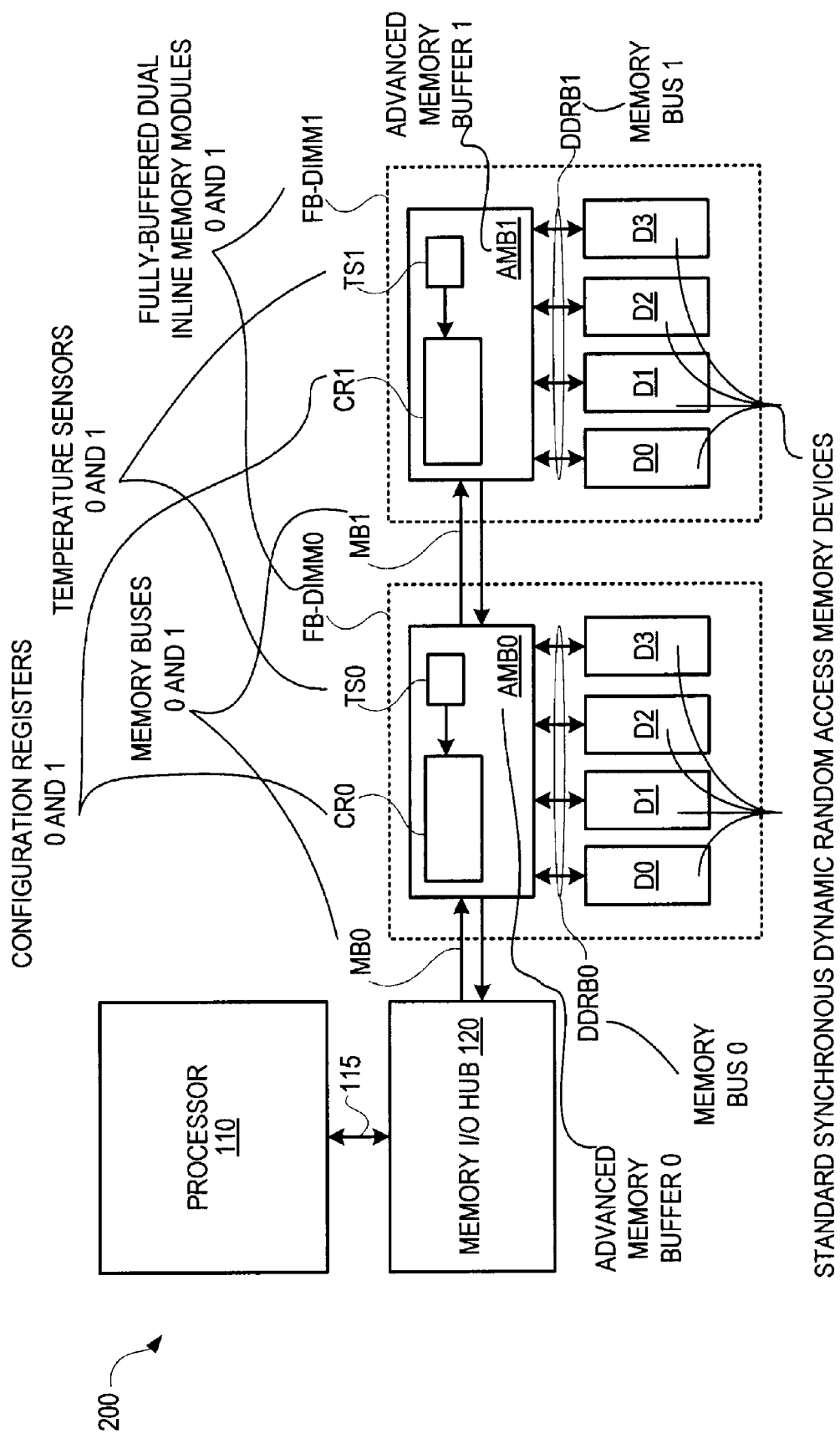
FIG. 2 illustrates a portion of an IHS coupled to a plurality of fully-buffered dual inline memory modules (FB-DIMMs).

Referring now to FIG. 2, an exemplary portion of an IHS 200 is illustrated, including a processor 110 connected by a front side bus 115 to a memory I/O hub 120, and a main memory subsystem comprising two memory buses MB0 and MB1 and two FB-DIMMs (FB-DIMM0 and FB-DIMM1). Memory buses MB0 and MB1 are point-to-point buses using unidirectional differential signaling on a plurality of high-speed bit lanes. Memory bus MB0 electrically couples memory I/O hub 120 with FB-DIMM0. Memory bus MB1 electrically couples FB-DIMM0 with FB-DIMM1 using a bus arrangement like MB0. Each bus comprises "southbound" lanes that transmit addresses/control signals/data in a direction away from the memory I/O hub and "northbound" lanes that transmit control signals/data in a direction towards the memory I/O hub.

Each FB-DIMM contains an Advanced Memory Buffer (AMB0 and AMB1, respectively) and a plurality of standard synchronous DRAM (Dynamic Random Access Memory) devices (four such devices, D0 to D3, are illustrated on each FB-DIMM). Each AMB has two narrow-width high-speed data/address ports and one wider, lower-speed data/address port. One of the high-speed ports is a "north" port that is electrically closest to the memory I/O hub; the other is a "south" port that is electrically further from the memory I/O hub. The wider port couples to the DRAM devices on the FB-DIMM over a traditional SDRAM bus, such as a bus using a known DDR (Double Data Rate), DDR2, or DDR3 signaling format. Thus on FB-DIMM0, buffer AMB0 has a north port coupled to MB0, a south port coupled to MB1, and a port to a traditional SDRAM bus DDRB0 coupled to SDRAMs D0-D3. On FB-DIMM1, buffer AMB1 has a north port coupled to MB1, a south port that is uncoupled (but could be coupled to an additional module), and a port to a traditional SDRAM bus DDRB1 coupled to another set of SDRAMs D0-D3.

In operation, buffer AMB0 serves as a data switch between MB0, MB1, and SDRAMs D0-D3 on FB-DIMM0. Buffer AMB0 buffers commands/data received on the southbound lanes of MB0 from memory I/O hub 120 and repeats the information on the southbound lanes of MB1 and/or memory bus DDRB0 (with appropriate translation to the SDRAM DDR bus data format). Buffer AMB0 also buffers commands/data received from AMB1 on the northbound lanes of MB1 and repeats the information on the northbound lanes of MB0 to memory I/O hub 120. Finally, buffer AMB0 buffers data read from SDRAMs D0-D3 over DDRB0 and transmits that data on the northbound lanes of MB0 to memory I/O hub 120.

Due to the multiple high-speed differential receivers/transmitters, buffers, multiplexers, demultiplexers, and attendant logic required for the operation of the AMB devices, much of which operate continually even when memory operations are idle, the AMB devices generally require much more power and a higher power density than the DRAM devices, and therefore also generate much more waste heat. In one embodiment, each DRAM device on an FB-DIMM consumes 0.1 to 0.5 W, while the AMB consumes 3-7 W, depending on operational state. The AMB thus requires a "thermal solution" to draw waste heat from the device and keep the device below a maximum operating temperature of about 110° C.

Figure 3:
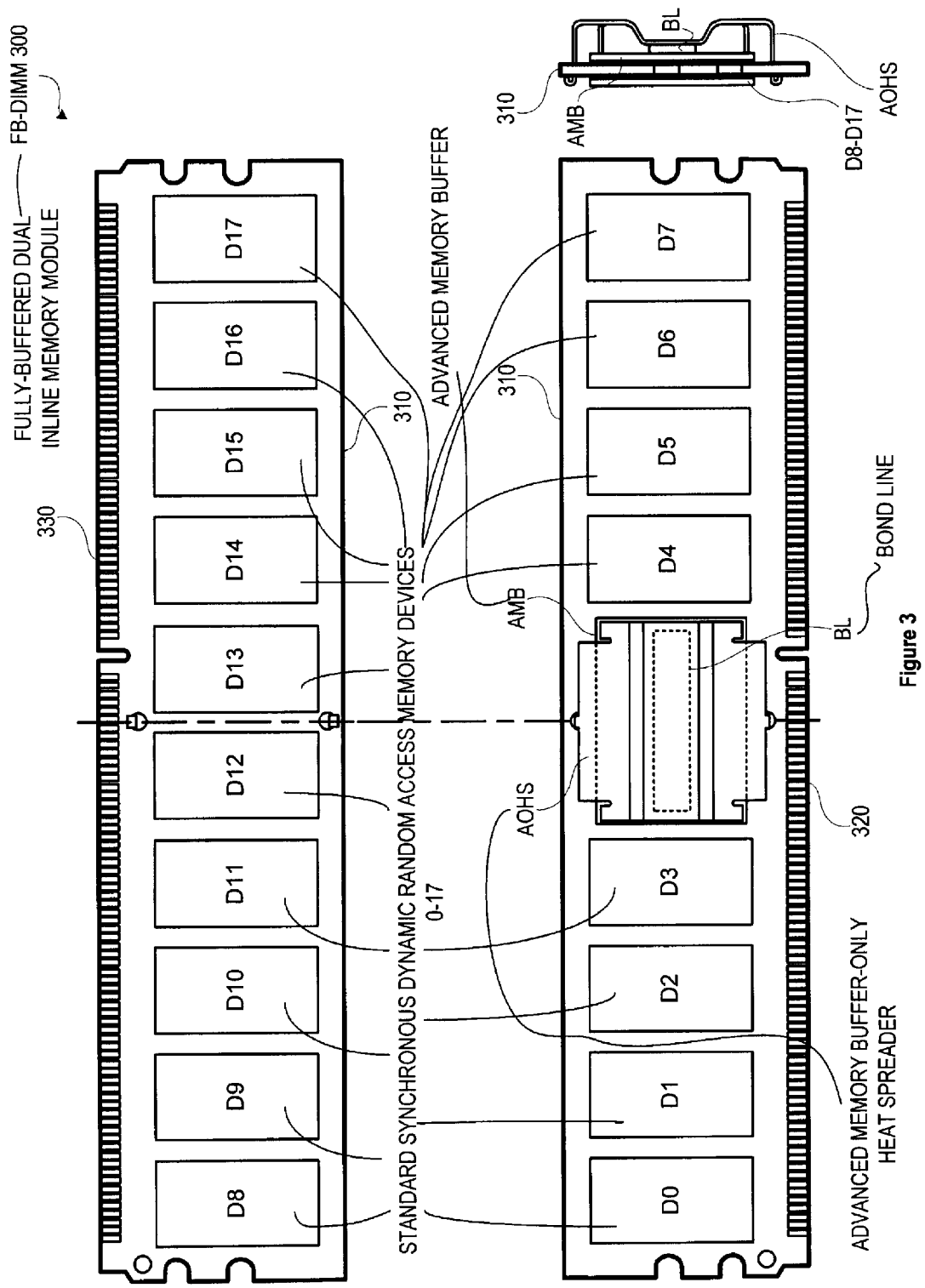
FIG. 3 depicts front, back, and side views of one embodiment of an FB-DIMM.

FIG. 3 shows front, back, and side views of the physical layout of one embodiment for an FB-DIMM 300 incorporating a thermal solution. The FB-DIMM comprises a printed circuit board 310 with rows of conductive fingers 320, 330 arranged along an edge designed for insertion in a bus slot. Eight SDRAMs D0-D7 are arranged on the front side of board 310, and ten SDRAMs D8-D17 are arranged on the back side of board 310. An AMB is also mounted, centered, on the front side of board 310. Connections fabricated on various internal layers (not shown) of circuit board 310 connect the AMB to selected fingers 320, 330 and the SDRAM devices. Others of fingers 320, 330 provide power and ground for the devices mounted on board 310.

A heat spreader AOHS (AMB-Only Heat Spreader) is secured to the card in a spaced arrangement over the AMB. Thermal contact between heat spreader AOHS and the AMB package occurs primarily through a bond line BL of a thermal interface material (TIM), such as a phase change TIM that reflows in the range of 50-60° C.

Figure 4:
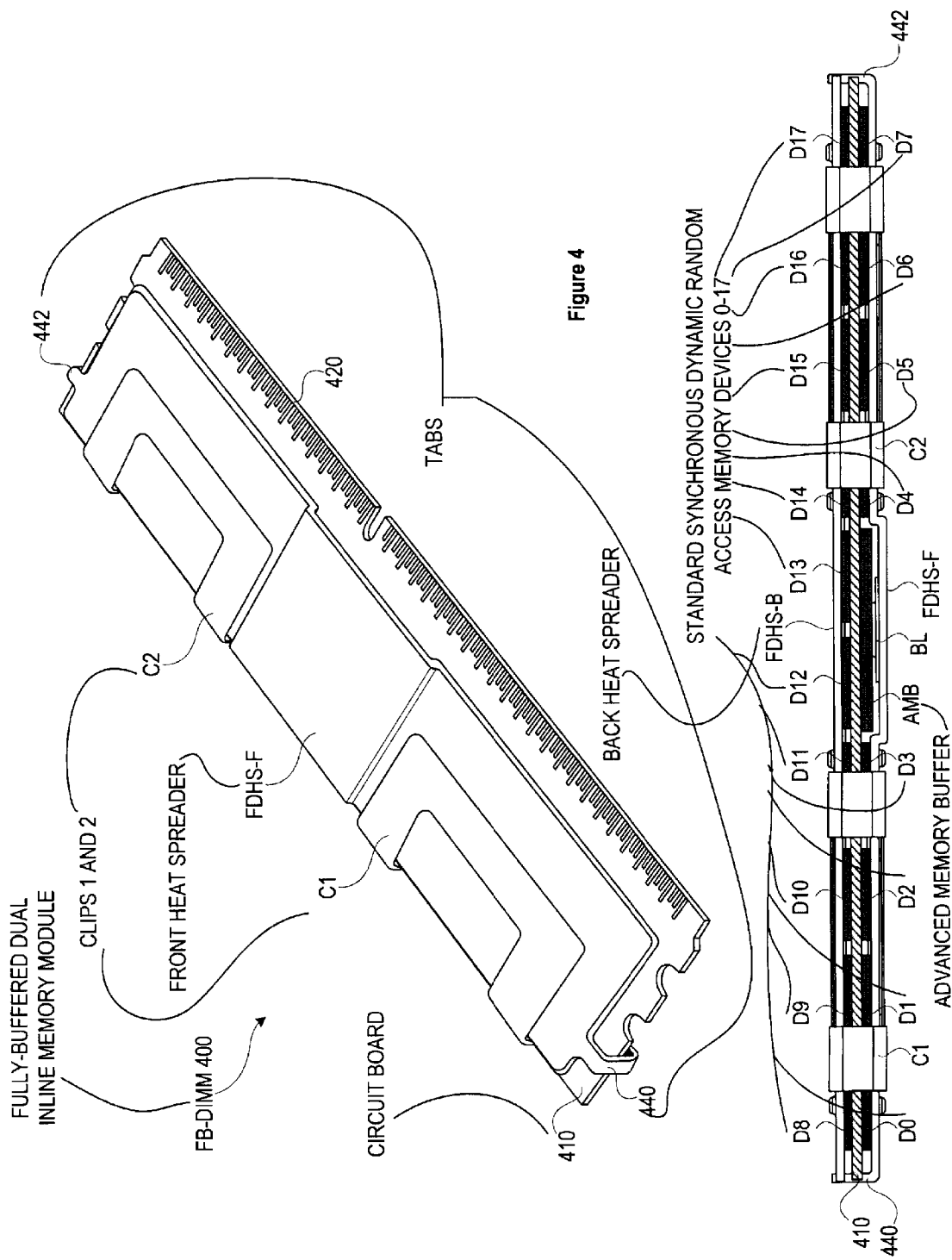
FIG. 4 shows a perspective view and top edge view of a second embodiment of an FB-DIMM.

FIG. 4 illustrates, in perspective view and edge view, a similar FB-DIMM 400 incorporating a different thermal solution. Like in FB-DIMM 300, FB-DIMM 400 comprises a printed circuit board 410 with rows of conductive fingers (one row of conductors 420 shown) arranged along an edge designed for insertion in a bus slot. Eight SDRAMs D0-D7 are arranged on the front side of board 410, and ten SDRAMs D8-D17 are arranged on the back side of board 410. An AMB is also mounted, centered, on the front side of board 410. Connections fabricated on various internal layers (not shown) of circuit board 410 connect the AMB to selected conductive fingers and the SDRAM devices. Other fingers provide power and ground for the devices mounted on board 410.

A heat spreader known as a Full-DIMM Heat Spreader (FDHS) is assembled over the SDRAMs and AMB on printed circuit board 410. The FDHS comprises four parts: a front heat spreader (FDHS-F), a back heat spreader (FDHS-B), and two retaining clips C1, C2. Thermal contact between front heat spreader FDHS-F and the AMB package occurs primarily through a bond line BL of thermal interface material. Front heat spreader FDHS-F is also bonded to SDRAMs D0-D7 using TIM. Back heat spreader FDHS-B is similarly bonded to SDRAMs D8-D17 using TIM. Front heat spreader FDHS-F is aligned to circuit board 410 using two tabs 440, 442 that locate within slots on the ends of circuit board 410. Front heat spreader FDHS-F also is aligned to back heat spreader FDHS-B using similar slots on the ends of FDHS-B. Clips C1 and C2 lock onto FDHS-F and FDHS-B, and through spring action hold FDHS-F and FDHS-B against the SDRAMs lying under the heat spreaders.

One issue with both the AOHS and FDHS heat spreader approaches is that thermal performance degrades significantly if the TIM does not make a good thermal connection between the AMB package and the heat spreader. This could be due to an improper or insufficient bond line application, improper spacing between the DIMM and the heat spreader, movement of the heat spreader after assembly, etc. In the assembled FB-DIMM, it may be difficult or impossible to check for proper TIM performance. Should one of these problems surface, however, the AMB will likely run hot, and may even run above its maximum design temperature.

Referring back to FIG. 2, each AMB is equipped with an on-chip temperature sensor (TS0 on AMB0 and TS1 on AMB1). The temperature sensor continually senses the chip temperature, and periodically updates a temperature measurement to a configuration register on the AMB (CR0 on AMB0 and CR1 on AMB1). Processor 110 can obtain these temperature measurements by reading from the configuration register addresses CR0 and CR1 over memory buses MB0 and MB1.

Figure 5:
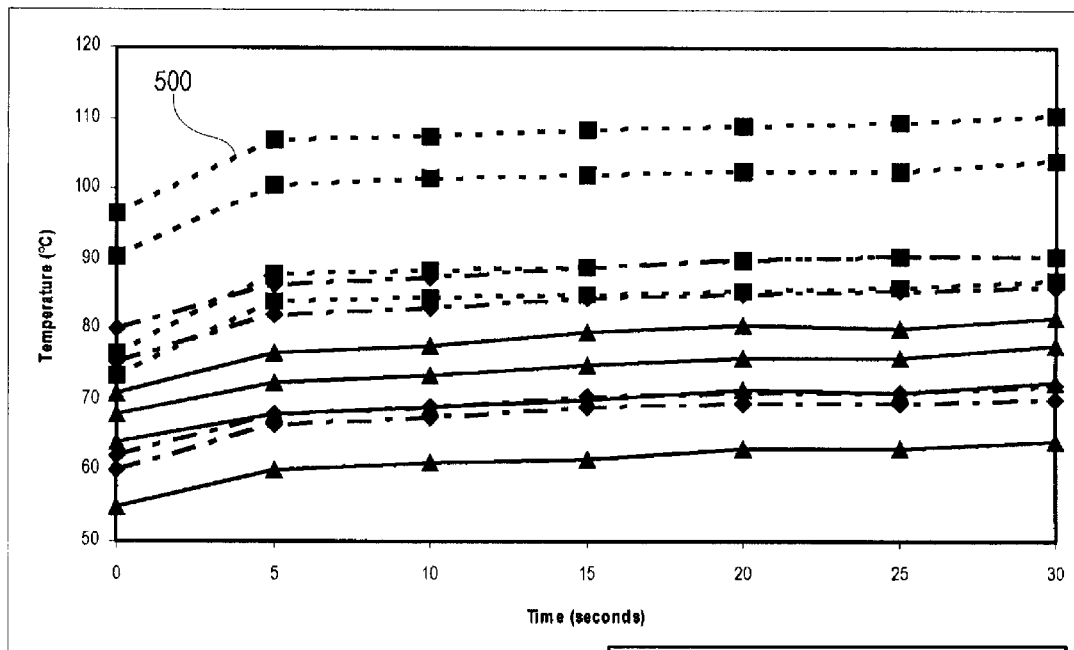
FIG. 5 contains a chart with plots of sensed temperature vs. time for twelve FB-DIMMs.

The on-board temperature sensors TS0 and TS1 typically produce temperature readings with a large uncertainty. Current AMB temperature sensors have absolute temperature uncertainty values of ±10° C. or larger across devices. FIG. 5 shows temperature plots (e.g., one marked 500) for 12 different FB-DIMMs: four with no heat sink, four with an FDHS and a phase change TIM bondline to the AMB installed, and four with an FDHS and a Gap Pad® TIM to the AMB installed (Gap Pad® is a registered trademark of the Bergquist Company). Each group of DIMMs reported temperatures scattered over a 20° C. or larger range under identical load conditions.

In an embodiment, the temperature readings are used to infer the thermal coupling status of a heat dissipation appliance (such as an AOHS or FDHS) that is nominally thermally coupled to a component such as an AMB. It has now been found that although the absolute temperature readings sensed by the AMB are generally too inaccurate by themselves for such a purpose, a different repeatable measurement technique can be successfully used despite the devices' widely varying temperature offsets. The measurement technique operates the AMB at a first load condition and substantially stable temperature readings. The AMB is then operated at a second, higher load condition, and one or more additional AMB temperature readings are taken as the temperature rises toward a second, higher temperature reading. The initial slope of the temperature rise is determined by the thermal mass and heat transfer characteristics of the system components designed to dissipate the increased heat generated at the second, higher load condition. When the AMB thermal solution is operating suboptimally, the AMB will register a faster initial temperature rise under the test conditions than when the AMB thermal solution is fully functional.

Figure 6:
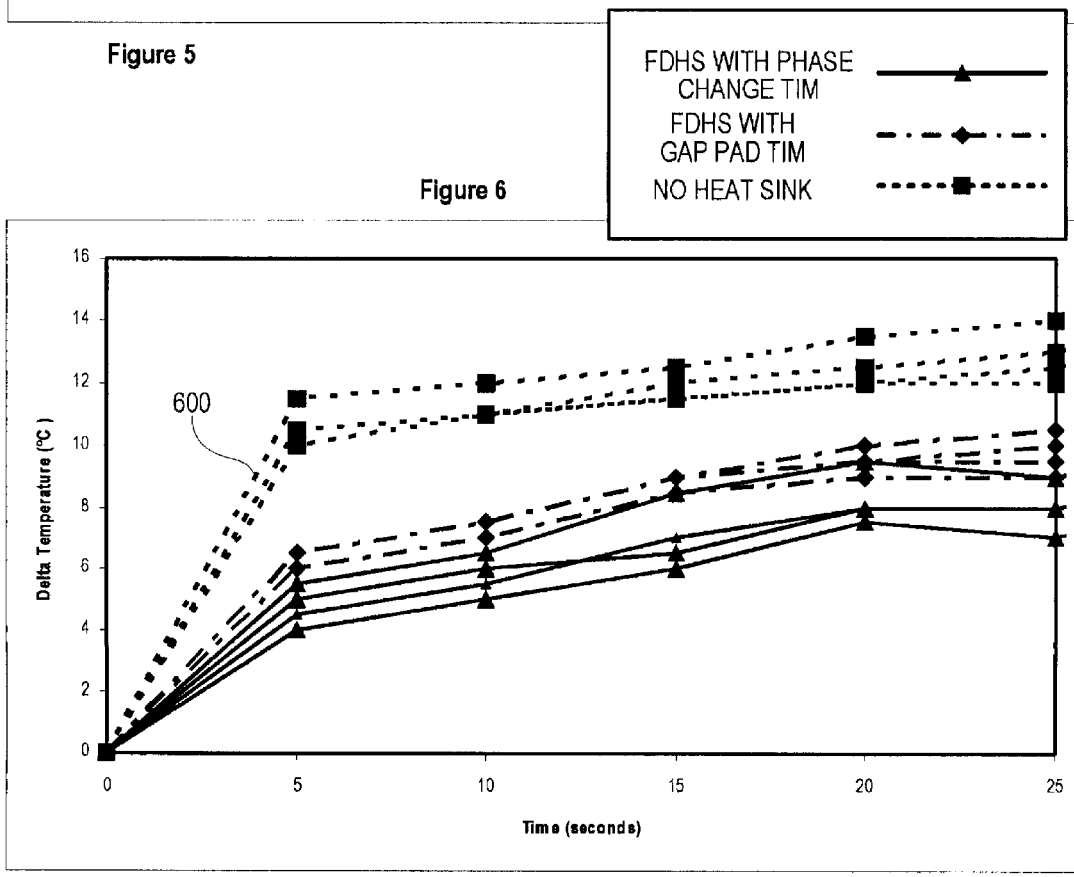
FIG. 6 contains a chart of delta temperature vs. time, plotted from the same data as FIG. 5.

FIG. 6 illustrates this principle for the same data shown in FIG. 5, except that each device plot shows the difference between an initial temperature reading (obtained around the time that the AMB is to be adjusted from the first load condition) and each temperature reading (plot 600 is typical). Thus each plot begins at a delta temperature of zero at time zero, which is about the time when the AMB load is increased from an idle condition to a full load condition. Subsequent readings show the temperature rise from time zero, measured at five second intervals.

The thermal solution performance can be distinguished, e.g., during the initial portion of the test period. The four DIMMs with no operating FDHS experienced an AMB-measured initial temperature rise of 10-11.5° C. during the first five seconds of the test. The four DIMMs with an FDHS and a phase change TIM experienced an AMB-measured initial temperature rise of 4-5.5° C. during the first five seconds of the test. The four DIMMs with an FDHS and a Gap Pad® TIM experienced an AMB-measured initial temperature rise of 6-6.5° C. during the first five seconds of the test. As the temperatures of the DIMMs begin to stabilize, the differential temperatures between the three groups become more difficult to distinguish.

As can be observed from FIG. 6, the initial temperature ramp during the test is an accurate indicator of heat sink performance. In other words, a better thermal coupling between the AMB and its heat sink will exhibit a lower temperature slope under the conditions of a low-to-high power load change in the device. Thus the initial temperature slope, for instance, can be used to detect proper functionality of the heat sink and thermal interface material. A slope that varies out of the expected range for the thermal solution towards the slope of an AMB with no heat sink indicates some sort of problem with the thermal solution.

Figure 7:
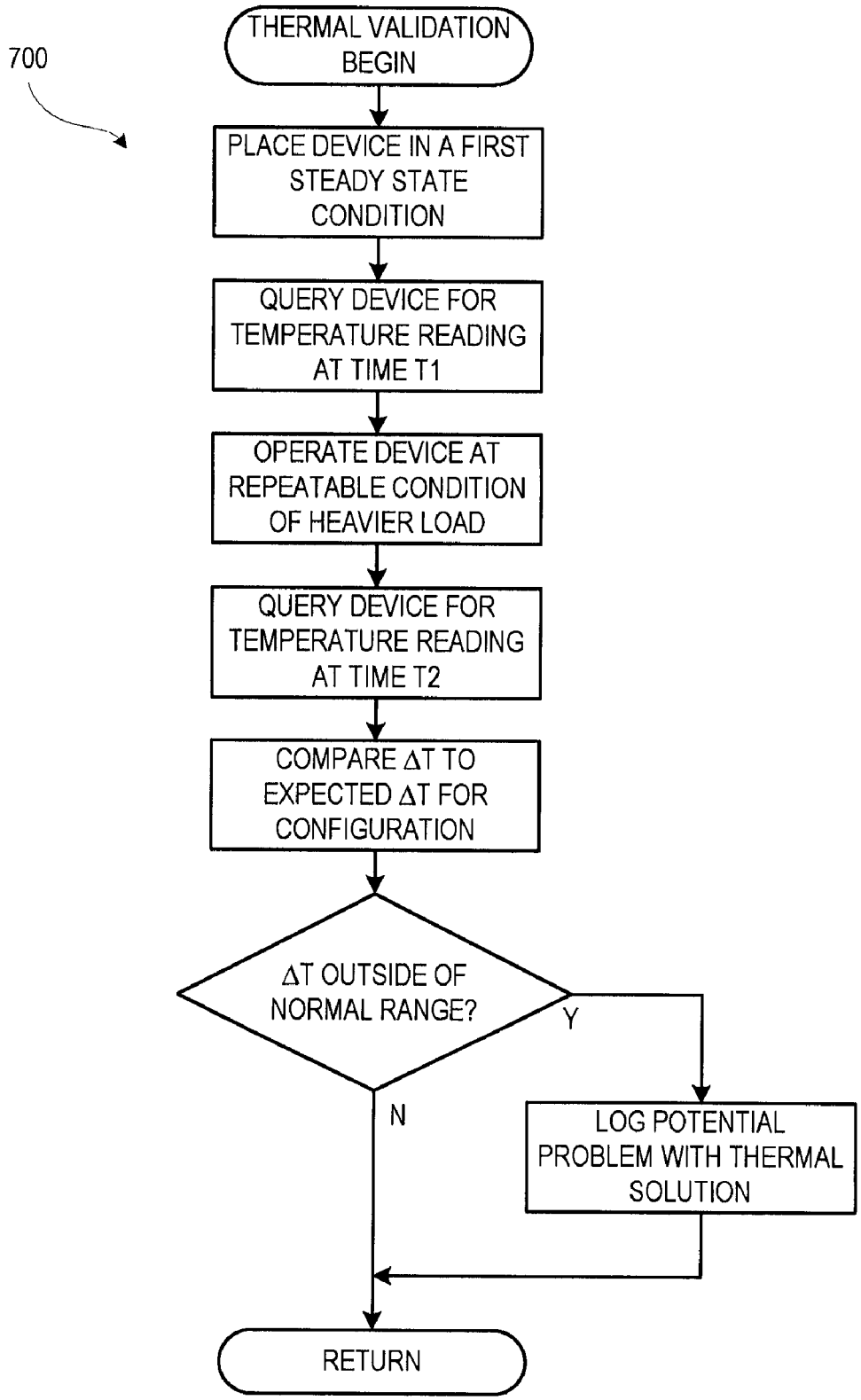
FIG. 7 contains a flowchart for a method of validating a thermal solution.

FIG. 7 illustrates a flowchart for a test procedure according to one embodiment. The device under test is first placed in a steady state condition, such as an idle condition. The device is queried for a temperature reading at a time T1. The device is then driven to a repeatable condition of heavier load, e.g., a full load condition. The device is queried for a temperature reading at a time T2, e.g., several seconds after the full load condition is initiated. A delta temperature between times T1 and T2 is calculated and compared to an expected delta temperature for the configuration. When the calculated delta temperature is outside of a normal range, a potential problem with the thermal solution is logged.

The delta temperature is one example of a transient thermal metric that can be calculated from the component temperature measurements to validate heat dissipation appliance performance. The metric preferably uses at least two temperature measurements—one taken before temperature begins to rise due to a load change on the component, and one taken shortly after the temperature begins to rise. The metric can be, e.g., a simple delta temperature, a slope, a fitted slope based on more than two measurements, or a curve fit to a more complicated function that models the expected temperature curve.

The metric can be used to detect potential thermal solution problems by comparing the metric to expected metric characteristics. These characteristics can be obtained in several ways. In one embodiment, characteristics such as mean and variance can be gathered over a baseline component sample for various known thermal coupling conditions, and known statistical methods can then be employed to classify a device under test according to various categories of thermal performance. In another embodiment, the specific device under test can be tested at various times, e.g., upon each boot of a system including the device. The test results can be compiled to produce statistics for the device. Should a subsequent test deviate substantially from the long-term statistics, a potential problem can be reported.

The thermal test described above can be integrated at several points along the manufacturing timeline, as well as after delivery of a system. As applied to an FB-DIMM, an FB-DIMM test appliance can be programmed to exercise tested DIMMs in a manner that allows the thermal test to be conducted in conjunction with other testing. For instance, basic AMB and SDRAM functionality can be tested with the device at a near-idle condition, followed by a high-speed memory test. Temperature readings can be taken prior to and during the high-speed memory test and used to test the thermal solution.

In the factory where an IHS is assembled, loaded with software, and burned-in, the burn-in process can include a similar test. As a system may include more than one DIMM, in a variety of configurations, the test process may require tailoring specific to the system memory configuration.

In a delivered system, a self-test function in the IHS, similar to that used in a burn-in process, can periodically check the thermal solution for FB-DIMMs and other components using critical thermal solutions.

Many other features of the described systems and methods may be varied as design parameters. Those skilled in the art recognize that various features and elements are alternately implementable using hardware, BIOS, or operating system approaches.

Although illustrative embodiments have been shown and described, a wide range of other modification, change and substitution is contemplated in the foregoing disclosure. Also, in some instances, some features of the embodiments may be employed without a corresponding use of other features. Accordingly, it is appropriate that the appended claims be constructed broadly and in manner consistent with the scope of the embodiments disclosed herein.

What is claimed is:

1. A method of operating an information handling system (IHS), the method comprising:
    operating a component coupled to the system at a first steady state average power consumption;
    measuring the temperature of the component to produce a first temperature measurement;
    operating the component at a second, higher power consumption for at least a first time period;
    measuring the temperature of the component at the end of the first time period to produce a second temperature measurement;
    calculating a transient thermal metric based at least in part on the first and second temperature measurements; and using the transient thermal metric to infer a physical bond line phase change thermal interface material coupling status of a heat dissipation appliance that is thermally coupled to the component.

2. The method of claim 1, wherein operating the component at the first steady state average power consumption comprises placing the component in an idle state for a period of time sufficient to allow the component temperature to substantially stabilize.

3. The method of claim 1, wherein the component is a memory buffer coupled to the system by a memory bus.

4. The method of claim 3, wherein the memory buffer is located on a memory module coupled to the system.

5. The method of claim 3, wherein the memory buffer is located on a common circuit board with a processor coupled to the memory buffer through the memory bus.

6. The method of claim 1, wherein measuring the temperature of the component comprises the component sensing its internal temperature with an on-board sensor.

7. The method of claim 6, further comprising:
the component placing the sensed internal temperature measurements in an on-board register accessible to the IHS, and the IHS retrieving the sensed internal temperature measurements from the on-board register.

8. The method of claim 1, wherein operating the component at the second, higher power consumption comprises operating the component at a substantially full load condition.

9. The method of claim 1, wherein calculating the transient thermal metric comprises calculating a temperature difference between the second and first temperature measurements.

10. The method of claim 1, wherein calculating the transient thermal metric comprises estimating a thermal slope based at least on the first and second temperature measurements.

11. The method of claim 1, wherein using the transient thermal metric to infer the thermal coupling status of the heat dissipation appliance comprises comparing the metric to expected metric characteristics for the component and heat dissipation appliance.

12. The method of claim 11, wherein the expected metric characteristics represent a baseline test.

13. The method of claim 12, further comprising:
performing the baseline test on similar components and heat dissipation appliances with known thermal coupling status.

14. The method of claim 12, further comprising:
performing the baseline test on the component at an earlier testing date.

15. The method of claim 11, further comprising:
generating a notification when the inferred thermal coupling status is suboptimal.

16. An information handling system (IHS) capable of electrical coupling with a component thermally coupled to a heat dissipation appliance, the IHS comprising:
at least one processor, the component at least partially controllable by the processor when the component is electrically coupled to the system; and
a routine, executable by the processor, to shift the component from a first power consumption condition to a second power consumption condition and observe at least one component temperature difference responsive to the shift, the routine operable to test a physical bond line phase change thermal interface material coupling of the component to the heat dissipation appliance.

17. The IHS of claim 16, wherein the component is a modular component and the IHS comprises a test fixture for the modular component.

18. The IHS of claim 16, wherein the component is an operational component of the IHS.

19. The IHS of claim 18, wherein the component comprises a memory buffer.

20. The IHS of claim 19, wherein the memory buffer is mounted on a common circuit board with the processor.

21. The IHS of claim 19, wherein the memory buffer is mounted on a memory module coupled to the IHS.

22. The IHS of claim 16, wherein the component comprises a temperature sensor that senses the on-board temperature of the component, the sensed temperature accessible to the processor.

* * * * *